US008108753B2

United States Patent
Anderson et al.

(10) Patent No.: US 8,108,753 B2
(45) Date of Patent: *Jan. 31, 2012

(54) METHOD OF COMPUTING PARTIAL CRCS

(75) Inventors: Richard E. Anderson, Jericho, VT (US); Christos John Georgiou, Scarsdale, NY (US); Peter A. Sandon, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 287 days.

This patent is subject to a terminal disclaimer.

(21) Appl. No.: 12/041,060

(22) Filed: Mar. 3, 2008

(65) Prior Publication Data

US 2008/0222488 A1 Sep. 11, 2008

Related U.S. Application Data

(63) Continuation of application No. 11/224,994, filed on Sep. 14, 2005, now Pat. No. 7,426,674, which is a continuation of application No. 10/605,436, filed on Sep. 30, 2003, now Pat. No. 7,010,469.

(51) Int. Cl.
*H03M 13/00* (2006.01)

(52) U.S. Cl. .................................. 714/758; 714/776

(58) Field of Classification Search .............. 714/758, 714/776
See application file for complete search history.

(56) References Cited

U.S. PATENT DOCUMENTS

| 4,450,561 | A | | 5/1984 | Gotze et al. |
| 5,121,397 | A | | 6/1992 | Norrod |
| 5,247,524 | A | | 9/1993 | Callon |
| 5,321,707 | A | | 6/1994 | Erickson et al. |
| 5,383,204 | A | | 1/1995 | Gibbs et al. |
| 5,410,546 | A | | 4/1995 | Boyer |
| 5,691,997 | A | | 11/1997 | Lackey, Jr. |
| 5,703,882 | A | * | 12/1997 | Jung et al. ............. 370/474 |
| 5,754,564 | A | | 5/1998 | Francis |
| 5,878,057 | A | | 3/1999 | Maa |
| 5,951,707 | A | * | 9/1999 | Christensen et al. ..... 714/752 |
| 5,991,911 | A | | 11/1999 | Zook |
| 6,038,694 | A | | 3/2000 | Swallow |

(Continued)

FOREIGN PATENT DOCUMENTS

EP 0987918 3/2000

OTHER PUBLICATIONS

B.C. Goldstein, et al., "Adaptive High-Speed CRC Generator/Checker", IBM Technical Bullentin, vol. 32, No. 8B, Jan. 1990.

(Continued)

*Primary Examiner* — M. Mujtaba K Chaudry
(74) *Attorney, Agent, or Firm* — Michael Le Strange; Roberts Mlotkowski Safran & Cole, P.C.

(57) ABSTRACT

Method of generating cyclic redundancy checks (CRCs) for a message with N data blocks. The method includes calculating a partial CRC for an out of order data block and storing the result, generating, using a division operation, a CRC remainder multiplier associated with the out of order data block and storing the result, repeating the calculating and generating steps until all N data blocks for the message are received, and combining the results of the calculating step and the generating step.

8 Claims, 7 Drawing Sheets

U.S. PATENT DOCUMENTS

| | | |
|---|---|---|
| 6,173,431 B1 | 1/2001 | Rittle |
| 6,349,138 B1 * | 2/2002 | Doshi et al. .................... 380/200 |
| 6,438,724 B1 * | 8/2002 | Cox et al. ....................... 714/758 |
| 6,446,234 B1 * | 9/2002 | Cox et al. ....................... 714/758 |
| 6,609,226 B1 * | 8/2003 | Figueira ......................... 714/807 |
| 6,647,518 B1 * | 11/2003 | Asmanis ......................... 714/707 |
| 6,851,086 B2 * | 2/2005 | Szymanski .................... 714/781 |
| 7,010,469 B2 | 3/2006 | Anderson et al. |
| 7,185,266 B2 * | 2/2007 | Blightman et al. ........... 714/776 |
| 7,243,289 B1 * | 7/2007 | Madhusudhana et al. .... 714/758 |
| 2004/0158793 A1 | 8/2004 | Blightman et al. |

OTHER PUBLICATIONS

Non-Final Office Action dated Apr. 20, 2010 in U.S. Appl. No. 11/937,204.

Final Office Action dated Sep. 20, 2010 in U.S. Appl. No. 11/937,204.

Office Action dated Dec. 30, 2010 in U.S. Appl. No. 11/937,204.
Notice of Allowance dated Feb. 24, 2011 U.S. Appl. No. 11/937,204.

* cited by examiner

METHOD OF COMPUTING PARTIAL CRCS

CROSS-REFERENCE TO RELATED APPLICATIONS

The present application is a continuation of U.S. application Ser. No. 11/224,994, filed on Sep. 14, 2005 now U.S. Pat. No. 7,426,674 which, in turn, is a continuation of U.S. application Ser. No. 10/605,436, filed Sep. 30, 2003, now U.S. Pat. No. 7,010,469 the disclosures of which are expressly incorporated by reference herein in its entirety.

BACKGROUND OF INVENTION

1. Field of the Invention

The present invention generally relates to a method of computing partial cyclic redundancy checks (CRCs) and, more particularly, a method for computing partial CRCs in real time for variable length data blocks and packets.

2. Background Description

Reliable transmission of data typically involves computation of error detecting checks, such as cyclic redundancy checks (CRCs), to support a wide range of protocols and transmission mediums. For example, the iSCSI (Internet Small Computer Systems Interface) standard provides a mechanism for exchanging SCSI commands and data over TCP/IP (Transmission Control Protocol/Internet Protocol). iSCSI defines a PDU (Protocol Data Unit) for the exchange between an iSCSI initiator and target. iSCSI PDUs may not be aligned to TCP segments or IP datagrams, because the TCP layer treats the data passed to and from an upper layer as a byte stream. Since TCP may break the byte stream at any arbitrary point, PDUs may not be aligned to TCP segments so that portions of PDUs may appear within a TCP segment. The iSCSI standard defines a CRC32 check to verify the integrity of PDU headers and data payloads.

One difficulty in computing CRC remainders is that portions of a PDU may arrive out of order from the network. The out of order delivery is a result of the underlying TCP/IP protocols used to transfer iSCSI PDUs. Traditional implementations of generating CRC remainders depend on the data being processed in order. The result of these behaviors of TCP/IP is that portions of an iSCSI PDU may be contained in different Ethernet packets which may arrive out of order. It is typically more difficult for hardware to compute the CRC when Ethernet frames (or similar frames) arrive out of order. The CRC algorithm itself creates part of the problem because the CRC result for a byte of data is dependent on all prior bytes over which the CRC is protecting. Thus, the CRC computation is not associative. The second factor is that the iSCSI PDUs are not aligned within any of the lower level portions of the protocol. Thus, a PDU boundary may occur anywhere within the data portion of a TCP segment and hence in the lower layers as well.

Another factor impacting the CRC generation is the increasing speed of networks. At higher speeds there is less time to process each packet. This has resulted in a number of approaches to offload the TCP/IP processing from the host onto specialized hardware and/or other processors. These approaches also minimize the number of times data is moved within a system. Ideally, the CRC generation should be accomplished as part of the other packet handling requirements.

Computing the CRC after all the parts of a PDU have been received consumes additional memory and bus bandwidth. Computing CRCs on the fly or in real time as PDUs arrive would be more efficient and flexible.

SUMMARY OF INVENTION

In an aspect of the invention, a method is provided for generating cyclic redundancy checks (CRCs) for a message with N data blocks that includes the steps of calculating a partial CRC for an out of order data block and storing the result, generating a CRC remainder multiplier associated with the out of order data block and storing the result, repeating the calculating and generating steps until all N data blocks for the message are received, and combining the results of the calculating step and the generating step.

In another aspect of the invention, an apparatus for generating cyclic redundancy checks (CRCs) for a message with N data blocks is provided. The apparatus comprising a component to calculate a partial CRC for an out of order data block and to store the result, a component to generate a CRC remainder multiplier associated with the out of order data block and to store the result, and a component to combine the results of the calculated partial CRC and the generate remainder multiplier.

In another aspect of the invention, a computer program product is provided comprising a computer usable medium having readable program code embodied in the medium and includes a first component to calculate a partial CRC for an out of order data block and storing the result, a second component to generate a remainder multiplier associated with the out of order data block and storing the result, and a third component to combine the results of the first component and the second component.

BRIEF DESCRIPTION OF DRAWINGS

The foregoing and other objects, aspects and advantages will be better understood from the following detailed description of embodiments of the invention with reference to the drawings, in which.

DETAILED DESCRIPTION

This invention is directed to computing partial CRCs by computing remainders of the powers of two as data blocks are received, instead of, for example, pre-computing them and storing them in a table. Although not shown, assuming there are a finite number of possible sizes, it is anticipated that a pre-computed table could be included in this embodiment.

Figure 1A:
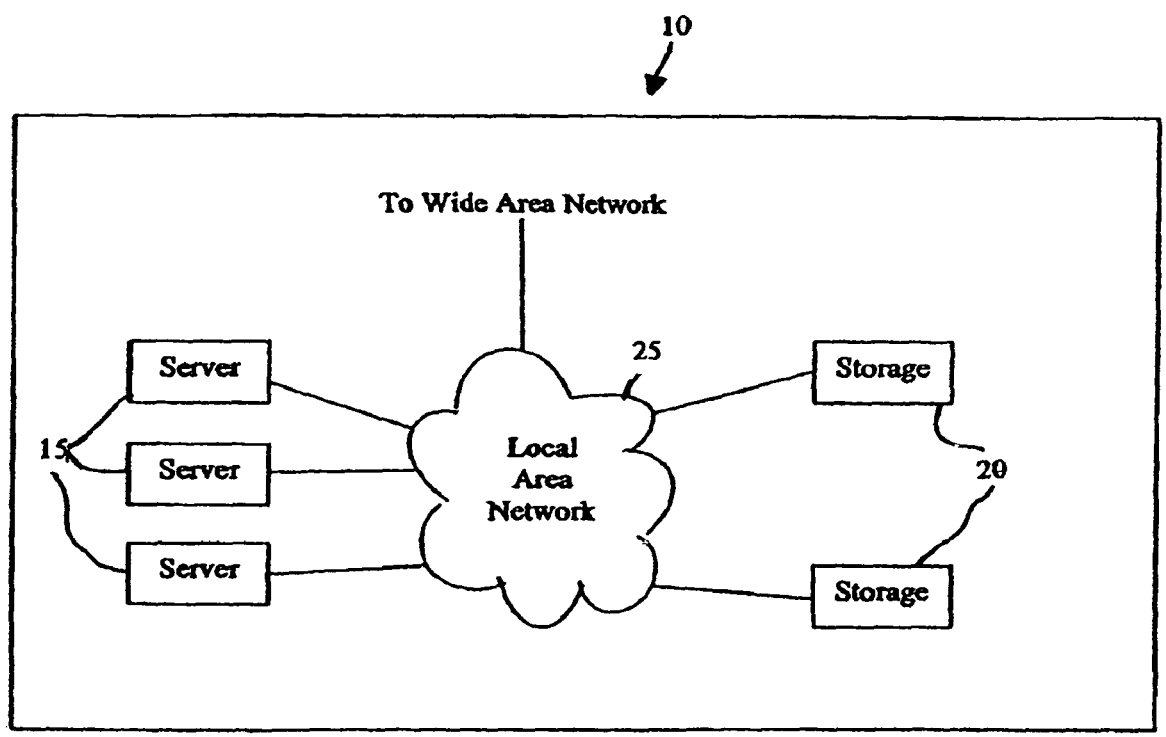
FIGS. 1A-1C are block diagrams showing exemplary configurations that may employ the invention.

CRCs are prevalent in many transmission mediums and protocol topologies. FIG. 1A is an exemplary block diagram of a typical network that may employ the invention, generally denoted by reference numeral 10, using CRCs in operation. FIG. 1A may include, for example, an Ethernet network running iSCSI on top of TCP/IP. Included in the exemplary network 10 are servers 15 and storage devices 20. The servers 15 may make requests for I/O operations such as reads and writes over a local area network 25 (LAN) to the storage devices 20. The LAN 25 may be connected to a Wide Area Network (WAN).

Figure 1B:
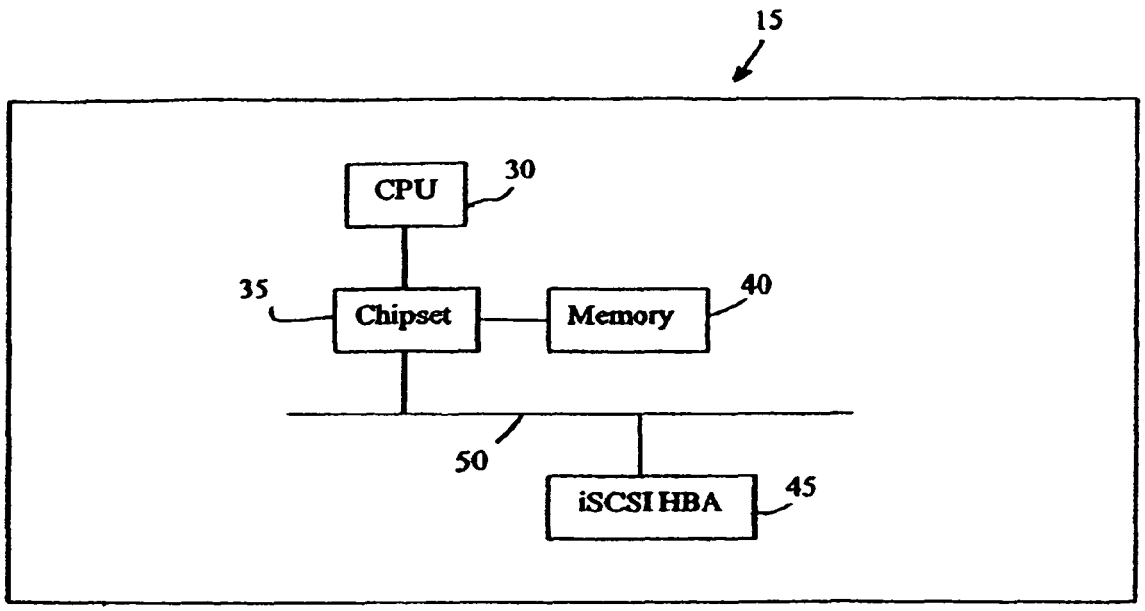

FIG. 1B is a block diagram showing an exemplary server configuration such as for server 15. The server configuration may include a CPU 30, a chipset 35, memory 40, and an iSCSI HBA (host bus adapter) 45. The iSCSI HBA 45 may also support, for example, generic TCP/IP and Remote Direct Memory Access (RDMA) communications in addition to the iSCSI protocol. The HBA is usually connected to a system bus 50, such as, for example, PCI-X within the server 15.

Figure 1C:
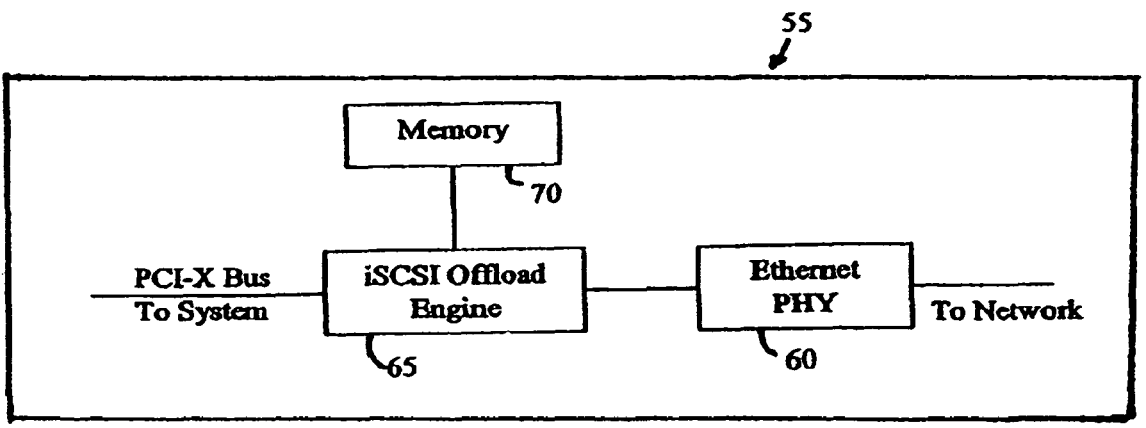

FIG. 1C is a block diagram of an exemplary configuration of an iSCSI offload engine environment, generally denoted by reference numeral 55. This configuration includes an interface 60 to the network shown in this example as an Ethernet physical interface, an iSCSI offload engine 65 which may be used, in embodiments, to calculate CRCs on the fly, and memory 70. The iSCSI offload engine may be connected to the server 15 via the PCI-X, or other suitable interface.

The term "data block" (also referred to as "block") refers to the smallest units of data which is a continuous sequence of bits. Data blocks may arrive out of order because the underlying transport mechanism such as Ethernet packets, for example, may arrive out of order. The term "message" refers to a set of one or more data blocks which have a defined order. The mapping of messages to packets breaks a message into data blocks. The term "packet" typically refers to a unit of data which is transmitted intact over a network. A packet may contain portions of one or more messages. A packet may contain other information as defined by the appropriate network protocol. A packet may arrive out of order and hence a data block contained in the packet may arrive out of order. The term "packet data" is the message protected by a CRC. The term "PDU" (protocol data unit) is an iSCSI term and is a type of message transferred over an Ethernet network. The term "data segment" refers to an iSCSI term and is typically an optional portion of a PDU and may also be a type of message.

Figure 2A:
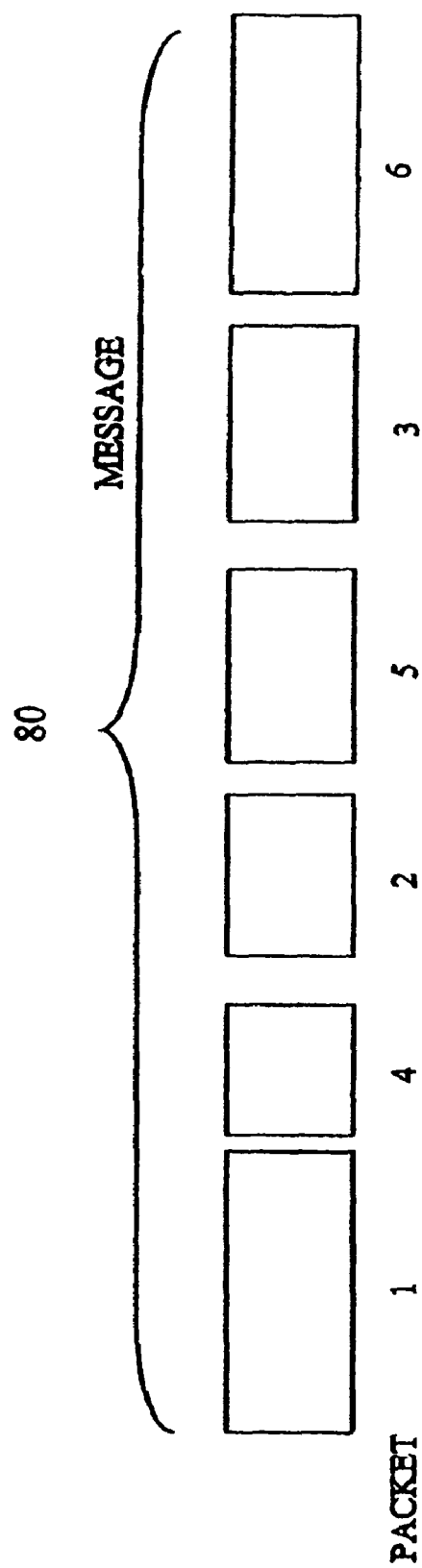
FIG. 2A is an illustrative diagram showing a message with out of order packets.

FIG. 2A is an illustrative diagram showing a message with out of order packets, generally denoted by reference numeral 80. The illustrative message contains six packets shown arriving out of order at a receiving point such as, for example, interface 60, for processing and calculation of partial and final CRCs according to the invention. The packets are also shown as being of differing lengths. Not shown are overhead and control information such as, for example, protocol headers. Since the packets contain data blocks which comprise a message, the message also arrives out of order. The data blocks may be of different lengths. One of ordinary skill in the art would recognize that any number of packets and variations in lengths may be possible and that the packets may arrive in any order, including all in order. This example is just one possible embodiment.

Figure 2B:
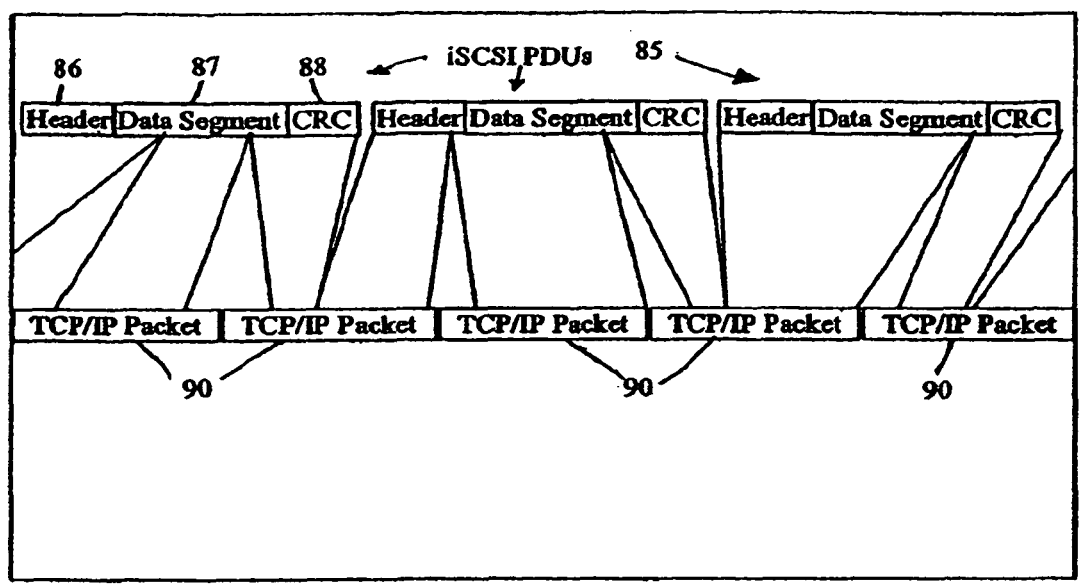
FIG. 2B is an illustrative diagram showing an embodiment of iSCSI PDUs in relation to TCP/IP packets.

FIG. 2B is an illustrative diagram showing an embodiment of iSCSI PDUs 85 in relation to TCP/IP packets 90. FIG. 2B illustrates how a series of PDUs may be transmitted in TCP/IP packets. Other embodiments may occur as one of ordinary skill in the art would recognize. The iSCSI PDU header 86 may include the basic header segment, optional additional header segment, and optional header digest as defined by the iSCSI standard (not shown). The iSCSI data is contained in the data segment 87 following the header. The data segment is protected by a data digest of which a 32-bit CRC 88 is defined by the iSCSI standard.

TCP processes data in a byte stream to and from an application such as iSCSI. Thus, the iSCSI PDUs are not aligned in any fashion within TCP/IP packets as they flow over a network. Parts of one or more iSCSI PDUs may be contained in a TCP/IP packet as well as an iSCSI PDU may spread over many TCP/IP packets, a situation that this invention handles more flexibly.

An aspect behind CRC checking is that a long bit string, a message, for example, may be characterized by the remainder calculated when that bit string is divided by a specific, shorter, divisor bit string. This divisor bit string is also referred to as the generating polynomial, and the remainder is the CRC value, or just CRC, of the original bit string. When a message is transmitted, this remainder is generated and transmitted as well. When the message is received, the remainder is recomputed and compared with the transmitted remainder. With a high probability that depends on the choice of generating polynomial, if the received and recomputed remainders match, then the message was transmitted and received without error.

There are two properties of remainders that are required by any partial CRC approach. First, the remainder of a sum of terms is equal to the sum of the remainders of those terms. Second, the remainder of a product of terms is equal to the product of the remainders of those terms. The division operation used to compute the remainders treats bit strings as binary polynomial coefficients, and along with all other operations on the remainders themselves, uses modulo-2 arithmetic (no carries), for computational efficiency. To insure that all operations on remainders are themselves remainders except for the divisor, a subtraction or division with the divisor is applied as needed.

The message over which the CRC is computed is represented in terms of data blocks as follows:

$$\text{Message} = B_0 \times 2^{S(P-1)} + B_1 \times 2^{S(P-2)} + \ldots + B_{(P-2)} \times 2^S + B_{(P-1)}$$

That is, there are P data blocks each containing S bits, and the $B_k$ are the bit patterns of each block. The CRC of the message can be computed by computing the CRC of the data blocks and combining. Traditionally, the $B_k$ are fed through a hardware CRC engine as each packet is received, and these values are saved in an array, such as, for example:

$$crc\_b[k] = CRC(B_k)$$

The CRCs for the powers of two are pre-computed and put in a table for exponents from 1 to L, where L is the number of data blocks in the largest possible packet:

$$crc\_2[k] = CRC(2^{S(P-k)})$$

When all data blocks of a message have been received, the CRC of the message is computed from the tabulated data as:

$$CRC(\text{message}) = crc\_b[0] \times crc\_2[1] + crc\_b[1] \times crc\_2[2]$$

where these sums and products are defined except for the generating polynomial, as previously described.

The invention provides a method for computing the full CRC from partial CRC computations in which any number of data blocks may comprise a message, and data block lengths are variable. To allow any number of data blocks per message, the expression for the Message is modified to:

$$\text{Message} = (\ldots((B_0 \times 2^S + B_1) \times 2^S B_2) \times 2^S \ldots + B_{(P-2)}) \times 2^S + B_{(P-1)} \text{ and then:}$$

$$CRC(\text{message}) = (\ldots(crc\_b[0] \times crc\_2 + crc\_b[1]) \times crc\_2 + crc\_b[2]) \times crc\_2$$

For fixed length data blocks, only $crc\_2 = CRC(2^S)$ is needed to complete the calculation no matter how many data blocks comprise a message.

Further flexibility is provided by the invention to accommodate variable length data blocks, as follows, built on the basic form of Equation No. 1:

$$\text{Message} = (\ldots((B_0 \times 2^{S_1} + B_1) \times 2^{S_2} + B_2) \ldots + B_{(P-2)}) \times 2^{S(P-1)} + B_{(P-1)} \quad (1)$$

where $S_k$ is the size in bits of cell $B_k$.

As each $B_k$ is being received, it is fed through a CRC engine to compute partial CRCs as follows:

$$crc\_b[k] = CRC(B_k) \quad (2)$$

Figure 3:
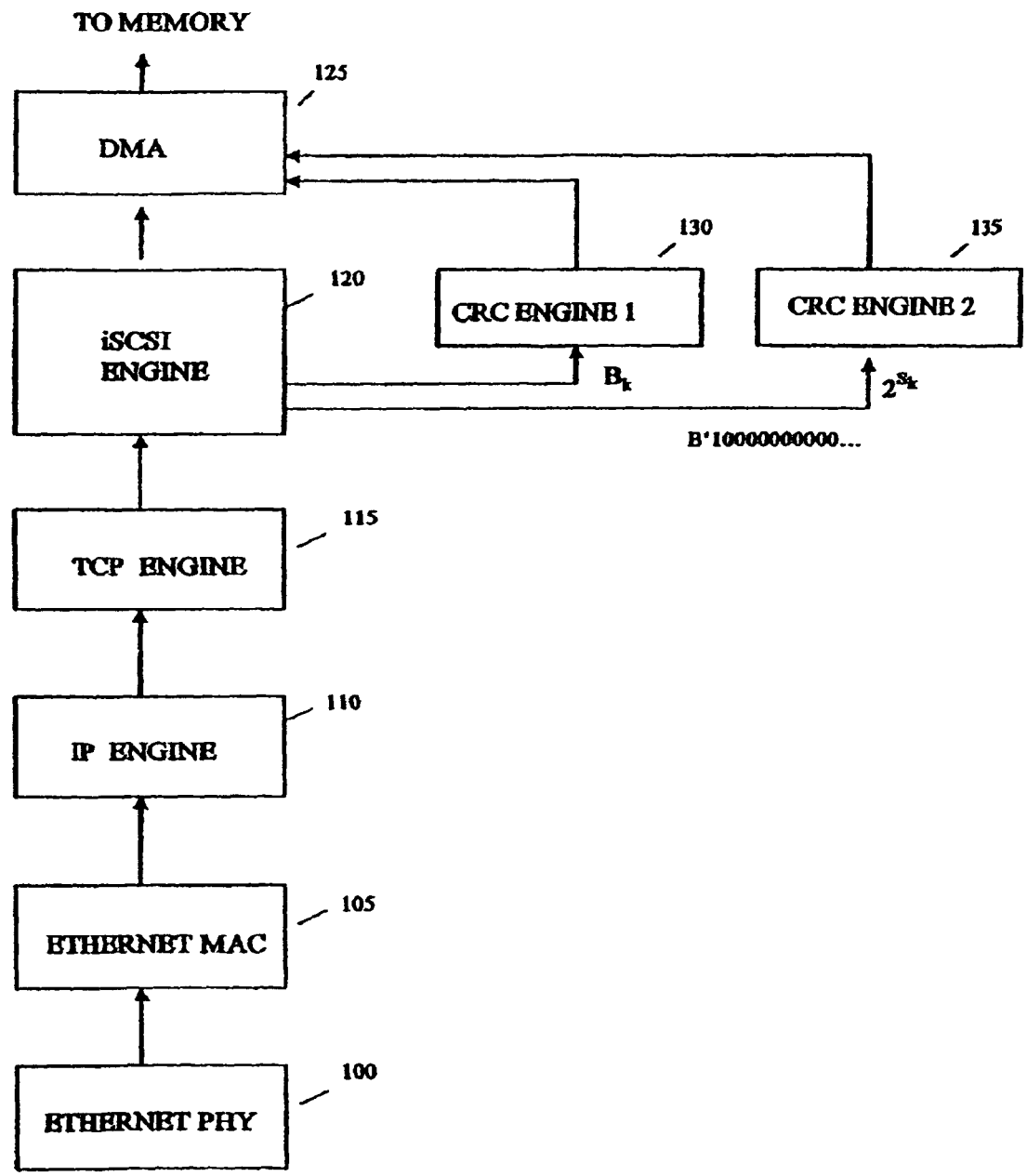
FIG. 3 is an illustrative flow diagram of an embodiment of using the present invention.

At the same time, a pattern of the same length (plus one bit) is fed through a second CRC engine (see FIG. 3). That pattern is $2^{Sk}$ $$crc\_2[k] = CRC(2^{Sk}) \quad (3)$$

Both the crc_b[k] and crc_2[k] values are saved until all of the data blocks have been received. At that time, the CRC over the entire message may be computed as shown in the following exemplary pseudo code (actual logic may assume variations as one of ordinary skill in the art will recognize):

Acc=crc_b[0]

For k=1 to P

Acc=(Acc×crc_2[k]+crc_b[k]) % poly

CRC(message)=Acc

Where poly is the generating polynomial and % is the remainder operator. An advantage to this approach is that there is no pre-computed table, and no restriction on the data block, message, or packet sizes.

USING THE INVENTION

Figure 4:
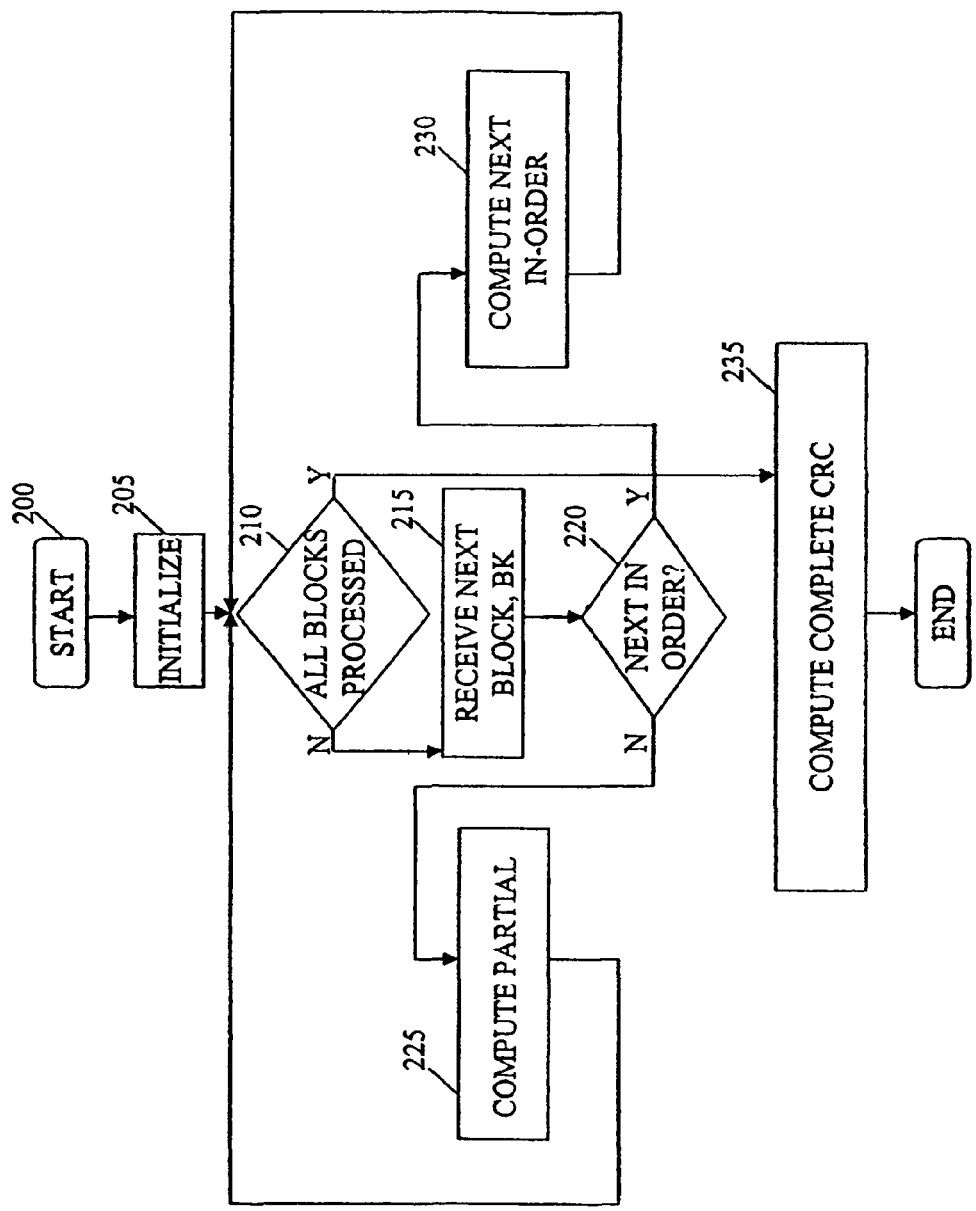
FIG. 4 is a flow diagram of an embodiment of the invention.
Figure 5:
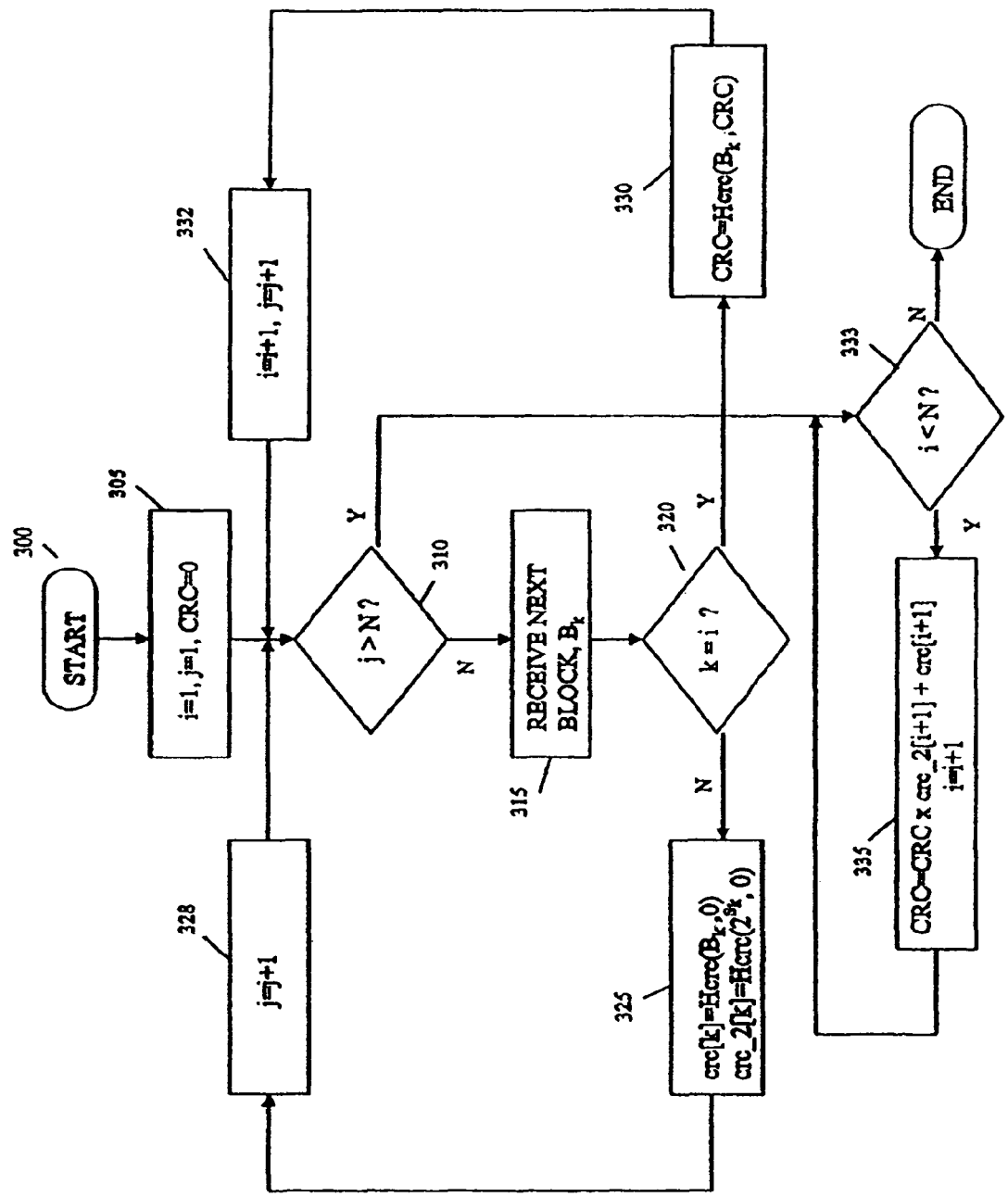
FIG. 5 is a flow diagram of an embodiment of using the invention.

FIGS. 3-5 are flow diagrams showing steps of embodiments of using the invention. FIGS. 3-5 may equally represent a high-level block diagram of components of the invention implementing the steps thereof. The steps of FIGS. 3-5 may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network.

FIG. 3 is a flow diagram illustrating an embodiment of a receive data flow, according to the invention. This embodiment employs iSCSI packets from an Ethernet network received from an Ethernet physical interface 100. Hardware handles the incoming packets at each layer of the protocol as illustrated by the Ethernet MAC 105, IP Engine 110, TCP Engine 115, and iSCSI engine 120. iSCSI engine 120 may, in embodiments, include CRC generation calculations according to the invention. CRC engines 130 and 135 may provide for on-the-fly CRC and partial CRC calculations. At least two types of CRC calculations may be done in an iSCSI environment, one at the Ethernet packet level (which may be done at the Ethernet Physical layer 100, as prescribed by the Ethernet protocol) and another done at the iSCI block level (which may take place at iSCSI engine 120, for example). The DMA 125 moves the incoming packet data to memory for further processing. Engines 120, 130, and 135 can be implemented, in other embodiments, in either software or hardware.

A CRC32 hardware engine may be placed in the networking dataflow to minimize bus and memory bandwidth as illustrated by the inclusion of CRC Engine 1 (130). Ideally, the CRC32 computation is performed just as, or just before, data from an Ethernet frame is placed into memory after it has been processed by TCP/IP and iSCSI offload engines (i.e., 115, 120, 130, or 135, respectively). When packets for a TCP connection carrying iSCSI PDUs arrive in order, it is straightforward for hardware to detect the PDU boundaries and check the CRC digests.

Referring to FIG. 3, the iSCSI engine 120 (e.g., 55 of FIG. 1C) identifies the data for which the CRC32 is to be calculated and passes it through to CRC Engine 1 (130). This engine computes the CRC of each block of data, $B_k$, whose length is $S_k$, as described in equation 2 above. If data is received out of order, the iSCSI engine also starts CRC Engine 2. CRC Engine 2 (135) computes the CRC multiplier remainder based on the input stream of B'1 followed by a stream of B'0 (as shown in FIG. 3) for the length of the input stream passed through CRC Engine 1 (130). That is, CRC Engine 2 computes the CRC of $2^{Sk}$, whose length is $S_k$, as described in equation 3 above. Once CRC Engine 2 is primed with the initial '1' bit, it runs in lock step with CRC Engine 1, both engines computing a CRC over $S_k+1$ bits. The results from both CRC engines are stored so that they are associated with the processed TCP segment. When all of the data blocks for an iSCSI PDU are received, the results from both CRC engines for each data block are combined according to the formulas (e.g., equations 2 and 3 and pseudo code) given above. This may be accomplished in software. CRC Engine 1 and CRC Engine 2 may be implemented on different or the same physical hardware.

FIG. 4 is a flow chart of an embodiment of the CRC computation process, according to the invention, starting at step 200. The steps of FIGS. 4 and 5 may be performed by engines 130 and 135. At step 205, initialization of logic control is performed. At step 210, a check is made if all blocks have been processed and if all blocks have been received and processed, then processing continues at step 235. If all blocks have not been processed, then at step 215, the next block, $B_k$, is received. At step 220, a check is made to determine if the next received block, $B_k$, is in order. If not received in order, at step 225, the partial CRC is computed for the block and saved for the final computation, and processing continues with step 210. If received in order, at step 230, the CRC is computed for next in-order block and the CRC computed over previous blocks received in-order may be used to initialize the hardware (or software, as appropriate) computation, reducing the amount of computation required in the final CRC computation at step 235. Process continues at step 210. If at step 210, the check determines that all blocks have been processed, then at step 235, a final complete CRC is computed over the entire message using all partial CRCs and in order CRC.

FIG. 5 is a flow diagram of an embodiment of the CRC computation process, according to the invention, beginning at step 300. This example also includes optimization for in order blocks. The message includes N blocks that may be received in arbitrary order. Blocks received out of order are processed by a hardware engine represented generally by the left hand side of the flowchart. The in order blocks are processed by a hardware engine represented generally by the right hand side of the flowchart and a final computation represented generally at the bottom of the flowchart.

The expression Hcrc (x,y) represents the hardware computation of the partial CRC of block x, starting with a remainder of y. Once all blocks have been received, the final computation of the message CRC may be performed in software (alternatively may be performed in hardware) using the partial CRC values computed over the N blocks and corresponding powers of 2. As an optimization, blocks, that are received in order may be processed by the hardware computation shown on the right hand side of the flowchart. In this case, the previously computed CRC is used as the initial remainder in the computation, which eliminates the corresponding iterations of the final computation.

The process continues at step 305 where the control variables i (next in order block number) and j (received number of blocks) are initialized to one and the packet CRC is initialized to zero, or other appropriate initialization value. At step 310, a check is made as to whether all blocks have been received and if not, at step 315, the next block $B_k$ is received. At step 320, a check as to whether this block is received in order is made.

If not, at step 325, the partial CRC is computed for block B along with the corresponding power of 2 multiplier remainder. At step 328, the new block is counted. Processing continues with step 310.

If the block is in order at step 320, then at step 330, the in order CRC is computed using the previously computed CRC as the initial remainder. At step 332, the next anticipated block number and received number of blocks are incremented. Processing continues at step 310.

If at step 310, the number of received blocks reaches the total number of blocks in the message, at step 333, a check is made whether every data block's CRC is included in the final CRC. If not, at step 335, stored partial CRCs are included, in turn, in the final CRC. Once all partial CRCs (if any were actually produced) are included in the final CRC (i.e., when i=N, at step 333) then the process ends.

By way of further example, the optimization effect of the invention is illustrated by assuming that a message consists of six blocks, which are received in the order: B6, B1, B4, B2, B3, B5. Block B6 is processed on the left hand side of FIG. 5, and then B1 is processed on the right. The first block (i.e., B1) is considered to be received "in order" whenever it is received. The next to be processed "in order" is B2. Therefore, B4 is processed on the left. Then B2 is processed on the right. B3 is next in order, so it is processed on the right. Finally, B5 is processed on the left.

For the final computation, B1 through B3 have been fully processed, so only the partial CRCs computed for B4, B5, and B6 need to be included in the final computation. A further extension of this optimization provides for all the partial sequences to be processed in this way, as blocks are received. Using the previous example, B5 would be processed using the result from B4, further reducing the amount of computation needed at the end. These optimizations reduce the amount of processing that software needs to perform in the final computation to the extent that blocks are received mostly in order.

In another embodiment, if the block prior to the current block has been received (not necessarily immediately prior to the immediate block) and resulted in a partial CRC calculation, then the results from the prior block may be used to initialize both CRC engines. By way of example, consider the block stream B1, B2, B4, B3, B5, and B6. In this case block B4 is received out of order. In this embodiment, B4 would be the first out of order block and would have a partial CRC computed, but in this embodiment, B3 would be considered in order and is a continuation of the in order processing of B1 and B2 since B3 is next in order to a previously received block, namely B2. The CRC remainder after processing B2 is used to initialize the CRC engine before processing B3. In like manner, B5 and B6 would be processed as an extension of the partial CRC for B4. This is accomplished by initializing the CRC engines with the CRC remainder and the multiplier remainder from the prior block, B4, before processing B5. In this embodiment, the number of terms to be combined is reduced to two (i.e., B1-B3, and B4-B6). This embodiment works with the flow of FIG. 4. The check for in order blocks, at step 220, may now include checking whether an immediately prior block number to the current block has already been received anytime. If yes, it is computed as an in order block at step 230 if in the in order sequence. Otherwise, computing as an extension of the partial CRC out of order sequence is provided. Thus using this alternate approach reduces the number of terms to be combined at the end.

Another embodiment may include precomputing the values which would be from the second CRC engine and place them in a table. This approach may be implemented in either hardware or software.

The invention may be utilized over a wide range of protocols and varying sizes of data blocks when the number of data blocks to be received is not known at the beginning of a packet or message transmission. The invention provides for substantial optimization and reduction of required processing and does not require the use of pre-computed powers of two. Initializing the CRC engines with data from a prior CRC computation result permits data blocks from different messages to be received correctly when intermixed by the network.

While the invention has been described in terms of embodiments, those skilled in the art will recognize that the invention can be practiced with modifications and in the spirit and scope of the appended claims.

What is claimed:

1. An apparatus for generating cyclic redundancy checks (CRCs) for a message with N data blocks, comprising:
    a component to calculate a partial CRC for an out of order data block and to store the result;
    a component to generate, using a division operation, a CRC remainder multiplier associated with the out of order data block and to store the result;
    a component to repeat the calculation of the partial CRC and the generation of the CRC remainder multiplier until all N data blocks for the message are received;
    a component to combine the results of the calculated partial CRC and the generated CRC remainder multiplier;
    a component to calculate a CRC for an in order data block using any previously computed in order CRC; and
    a component to initialize a first CRC engine to calculate the CRC for the in order data block, and to initialize the first CRC engine with a partial CRC remainder and a second CRC engine with the CRC remainder multiplier for calculating the partial CRC for the out of order data block, the partial CRC remainder and the CRC remainder multiplier being a result of a prior partial CRC computation.

2. The apparatus of claim 1, wherein the component to initialize permits data blocks from different messages to be received correctly when intermixed by the network.

3. An apparatus for generating cyclic redundancy checks (CRCs) for a message with N data blocks, comprising:
    a component to calculate a partial CRC for an out of order data block and to store the result;
    a component to generate, using a division operation, a CRC remainder multiplier associated with the out of order data block and to store the result;
    a component to combine the results of the calculated partial CRC and the generated CRC remainder multiplier;
    a component to calculate a CRC for an in order data block using an immediately previously calculated in order CRC, if available;

a component to initialize a first CRC engine to calculate the CRC for the in order data block, and to initialize the first CRC engine and a second CRC engine for calculating the partial CRC for the out of order data block; and a component to produce a final CRC by combining the output from the component to combine results of the calculated partial CRC and the generator multiplier with the output from the component to calculate a CRC for an in order data block using an immediately previously calculated in order CRC, if available.

4. The apparatus of claim 3, wherein the component to produce a final CRC includes a means to divide by a generating polynomial.

5. An apparatus for generating cyclic redundancy checks (CRCs) for a message with N data blocks, comprising:

a component to calculate a partial CRC for an out of order data block and to store the result;

a component to generate, using a division operation, a CRC remainder multiplier associated with the out of order data block and to store the result;

a component to repeat the calculation of the partial CRC and the generation of the CRC remainder multiplier until all N data blocks for the message are received;

a component to combine the results of the calculated partial CRC and the generated CRC remainder multiplier;

a component to calculate a CRC for an in order data block using an immediately previously calculated in order CRC; and a component to initialize a first CRC engine to calculate the CRC for the in order data block, and to initialize the first CRC engine and a second CRC engine for calculating the partial CRC for the out of order data block, wherein the component to calculate a partial CRC provides for calculating the partial CRC according to $crc\_b[k]=CRC(B_k)$, where $crc\_b[k]$ being the partial CRC for data block k and $B_k$ being the data block bit pattern of data block k.

6. An apparatus for generating cyclic redundancy checks (CRCs) for a message with N data blocks, comprising:

a component to calculate a partial CRC for an out of order data block and to store the result;

a component to generate, using a division operation, a CRC remainder multiplier associated with the out of order data block and to store the result;

a component to repeat the calculation of the partial CRC and the generation of the CRC remainder multiplier until all N data blocks for the message are received;

a component to combine the results of the calculated partial CRC and the generated CRC remainder multiplier;

a component to calculate a CRC for an in order data block using an immediately previously calculated in order CRC; and a component to initialize a first CRC engine to calculate the CRC for the in order data block, and to initialize the first CRC engine and a second CRC engine for calculating the partial CRC for the out of order data block, wherein the component to generate a remainder multiplier provides for generating the remainder multiplier according to $crc\_2[k]=CRC(2^{S_k})$, where $crc\_2[k]$ is the remainder multiplier for data block k, and $S_k$ is the bit length of data block k.

7. The apparatus of claim 6, wherein the component to generate the remainder multiplier includes a means to supply a bit pattern of length $S_k$ plus one bit to a CRC engine.

8. An apparatus for generating cyclic redundancy checks (CRCs) for a message with N data blocks, comprising:

a component to calculate a partial CRC for an out of order data block and to store the result;

a component to generate, using a division operation, a CRC remainder multiplier associated with the out of order data block and to store the result;

a component to repeat the calculation of the partial CRC and the generation of the CRC remainder multiplier until all N data blocks for the message are received;

a component to combine the results of the calculated partial CRC and the generated CRC remainder multiplier;

a component to calculate a CRC for an in order data block using an immediately previously calculated in order CRC; and a component to initialize a first CRC engine to calculate the CRC for the in order data block, and to initialize the first CRC engine and a second CRC engine for calculating the partial CRC for the out of order data block, wherein the N data blocks contain at least one data block of the N data blocks that is one of a different length and a same length.

* * * * *